United States Patent
Tanaka et al.

(10) Patent No.: US 9,572,246 B2
(45) Date of Patent: Feb. 14, 2017

(54) PRINTED WIRING BOARD

(71) Applicant: JAPAN AVIATION ELECTRONICS INDUSTRY, LIMITED, Shibuya-ku, Tokyo (JP)

(72) Inventors: Yukitaka Tanaka, Tokyo (JP); Chikara Kawamura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 14/634,597

(22) Filed: Feb. 27, 2015

(65) Prior Publication Data
US 2015/0289362 A1    Oct. 8, 2015

(30) Foreign Application Priority Data
Apr. 8, 2014  (JP) ................. 2014-079092

(51) Int. Cl.
*H05K 1/00*    (2006.01)
*H05K 1/02*    (2006.01)
(Continued)

(52) U.S. Cl.
CPC ............ *H05K 1/0219* (2013.01); *H01R 9/034* (2013.01); *H01R 9/035* (2013.01); *H01R 12/53* (2013.01);
(Continued)

(58) Field of Classification Search
CPC .. H05K 1/0221; H05K 1/0222; H05K 1/0219; H05K 1/0224; H05K 1/117; H05K 2201/09236; H05K 2201/09336
(Continued)

(56) References Cited

U.S. PATENT DOCUMENTS 4,871,319 A * 10/1989 Babow .................. H01R 12/62
                                              439/493
5,640,048 A *  6/1997 Selna .................. H01L 23/3128
                                              361/780
(Continued)

FOREIGN PATENT DOCUMENTS

JP    2007019232 A    1/2007
JP    2007123741 A    5/2007
(Continued)

OTHER PUBLICATIONS

Machine Translation of Nakazaki (JP 2010-251554A).*
(Continued)

*Primary Examiner* — Chau N Nguyen
*Assistant Examiner* — Roshn Varghese
(74) *Attorney, Agent, or Firm* — Holtz, Holtz & Volek PC (57) ABSTRACT

A printed wiring board comprises a pattern layer, an insulating layer and a ground layer laminated in an upper-lower direction. The printed wiring board is formed with one or more vias. The insulating layer is provided between the pattern layer and the ground layer. The ground layer is formed with a ground pattern. The pattern layer is formed with one common ground plane and two or more pads. The pads are arranged in a lateral direction. The common ground plane is located forward of the pads in the front-rear direction. The vias include a first via that connects the common ground plane and the ground pattern with each other. The pads include one or more ground pads and one or more signal pads. The ground pads are connected with the common ground plane. The signal pads are unconnected with the common ground plane.

10 Claims, 7 Drawing Sheets

(51) Int. Cl.
*H01R 9/03* (2006.01)
*H01R 12/53* (2011.01)
*H01R 13/6471* (2011.01)
*H01R 13/6473* (2011.01)
*H05K 1/11* (2006.01)

(52) U.S. Cl.
CPC ...... *H01R 13/6471* (2013.01); *H01R 13/6473* (2013.01); *H05K 1/117* (2013.01); *H05K 2201/0723* (2013.01); *H05K 2201/09336* (2013.01); *H05K 2201/09618* (2013.01); *H05K 2201/10356* (2013.01)

(58) Field of Classification Search
USPC .......................................... 174/250; 439/941
See application file for complete search history.

(56) References Cited

U.S. PATENT DOCUMENTS

| | | | |
|---|---|---|---|
| 6,808,419 B1* | 10/2004 | Korsunsky | H01R 23/688 439/607.23 |
| 7,232,314 B2 | 6/2007 | Abe | |
| 7,688,594 B2 | 3/2010 | Muto et al. | |
| 8,130,504 B2 | 3/2012 | Muto et al. | |
| 8,437,583 B2 | 5/2013 | Ban | |
| 8,440,910 B2 | 5/2013 | Nonen et al. | |
| 2006/0046569 A1* | 3/2006 | Kondou | H01R 9/032 439/497 |
| 2008/0038941 A1* | 2/2008 | Bartholomew | H05K 1/0219 439/76.1 |
| 2009/0277665 A1* | 11/2009 | Kumamoto | H01R 9/035 439/638 |
| 2012/0064762 A1 | 3/2012 | Muroi et al. | |

FOREIGN PATENT DOCUMENTS

| | | |
|---|---|---|
| JP | 2007234258 A | 9/2007 |
| JP | 2008218225 A | 9/2008 |
| JP | 2009218085 A | 9/2009 |
| JP | 2010191346 A | 9/2010 |
| JP | 2010251554 A | 11/2010 |
| JP | 2011023319 A | 2/2011 |
| JP | 2011096403 A | 5/2011 |
| JP | 2011096574 A | 5/2011 |
| JP | 2012064338 A | 3/2012 |
| JP | 2012129271 A | 7/2012 |

OTHER PUBLICATIONS

Japanese Office Action dated May 14, 2015 issued in counterpart Japanese Application No. 2014-079092.
Japanese Office Action dated Oct. 9, 2014 issued in Japanese Application No. 2014-079092.

* cited by examiner

PRINTED WIRING BOARD

CROSS REFERENCE TO RELATED APPLICATIONS

An applicant claims priority under 35 U.S.C. §119 of Japanese Patent Application No. JP2014-079092 filed Apr. 8, 2014.

BACKGROUND OF THE INVENTION

This invention relates to a printed wiring board which is available as a relay board that relays electric signals.

For example, this type of printed wiring board is disclosed in JP-A 2012-64338 (Patent Document 1), the content of which is incorporated herein by reference.

Figure 13:
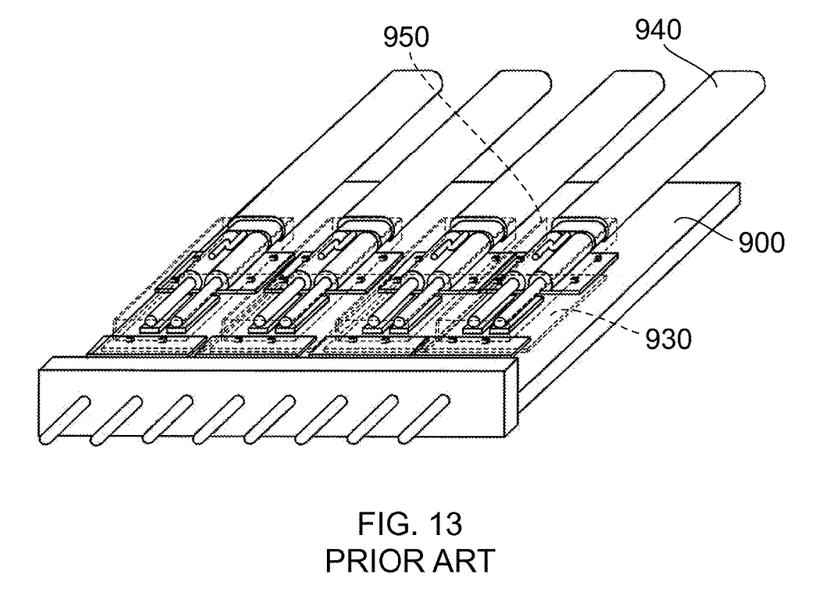
FIG. 13 is a perspective view showing a board, shield covers and cables of Patent Document 1.
Figure 14:
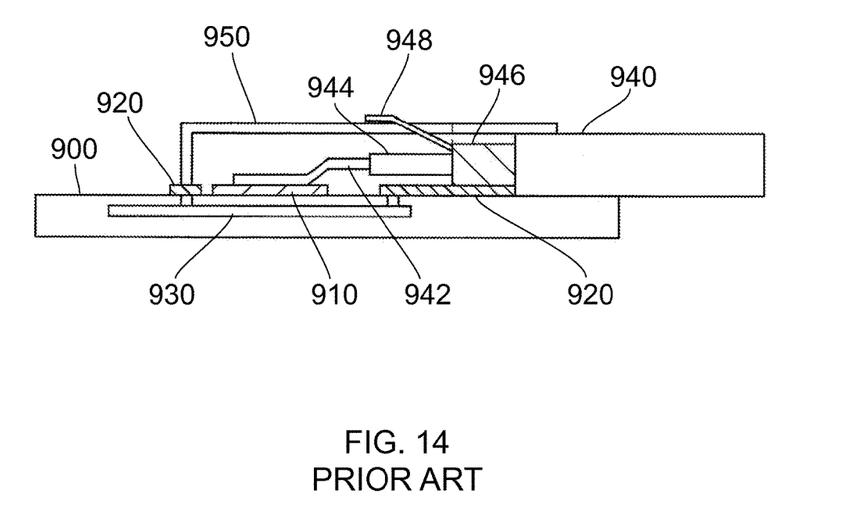
FIG. 14 is a cross-sectional view showing the board, the shield cover and the cable of FIG. 13.

As shown in FIGS. 13 and 14, a board (printed wiring board) 900 disclosed in Patent Document 1 is formed with electrodes (signal electrodes) 910, ground electrodes 920 and grounded plates 930. The ground electrodes 920 are connected with the grounded plates 930, respectively. The board 900 is connected with twinaxial cables (cables) 940 and has shield covers 950 attached thereto. Each of the cables 940 has a conductive line (signal conductor) 942, a dielectric body 944 covering the signal conductor 942, a shield layer (ground conductor) 946 covering the dielectric body 944, and a drain wire 948 connected to the ground conductor 946. The dielectric body 944 and the ground conductor 946 are peeled off at an end portion of the cable 940 to expose the signal conductor 942. The signal conductor 942 is connected to the signal electrode 910 of the board 900 while the ground conductor 946 is connected to the ground electrode 920. The drain wire 948 is connected to the shield cover 950.

The shield cover 950, the ground electrode 920 and the grounded plate 930 are connected together and cover around the end portion of the cable 940, or around the exposed portion where the dielectric body 944 and the ground conductor 946 are peeled off. Because the exposed portion of the cable 940 is thus covered by the ground potential, impedance of the exposed portion of the cable 940 can be matched with impedance of an unexposed portion that is other than the exposed portion.

The board 900 of Patent Document 1 is required to have the shield cover 950 attached thereto, wherein the shield cover 950 is formed separately from the board 900. Accordingly, material cost and assembly cost increase. Moreover, because this structure makes it difficult for the pitch of the signal electrodes 910 to be smaller, the board 900 is difficult to be reduced in size. In addition, the board 900 and the shield cover 950 have a gap formed therebetween, wherein the gap has a size nearly equal to a thickness of the signal electrode 910 or the ground electrode 920. Accordingly, for example, when two cables 940 are connected to adjacent two of the signal electrodes 910, respectively, these adjacent signal electrodes 910 might cause cross-talk therebetween along a surface of the board 900.

SUMMARY OF THE INVENTION

It is therefore an object of the present invention to provide a printed wiring board which is connectable to a cable such as a twinaxial cable or a coaxial cable, and which can prevent cross-talk and can be reduced.

One aspect of the present invention provides a printed wiring board comprising a pattern layer, an insulating layer and a ground layer laminated in an upper-lower direction. The printed wiring board is formed with one or more vias. The printed wiring board has a front end and a rear end in a front-rear direction perpendicular to the upper-lower direction. The insulating layer is provided between the pattern layer and the ground layer. The ground layer is formed with a ground pattern. The pattern layer is formed with one common ground plane and two or more pads. The pads are arranged in a lateral direction perpendicular to both the upper-lower direction and the front-rear direction. Each of the pads is positioned at a position which is nearer to the front end than to the rear end in the front-rear direction. The common ground plane is located forward of the pads in the front-rear direction. The vias include a first via that connects the common ground plane and the ground pattern with each other. The pads include one or more ground pads and one or more signal pads. The ground pads are connected with the common ground plane. The signal pads are unconnected with the common ground plane.

According to the present invention, the ground pads are arranged in the lateral direction together with the signal pads while being connected with the common ground plane. Accordingly, even when the signal pads are connected to signal conductors of coaxial cables, the signal pads can be prevented from causing cross-talk therebetween along a surface of the printed wiring board only by properly arranging the signal pads and the ground pads without attaching another member to the printed wiring board. The printed wiring board according to the present invention is therefore suitable to be reduced.

An appreciation of the objectives of the present invention and a more complete understanding of its structure may be had by studying the following description of the preferred embodiment and by referring to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 1:
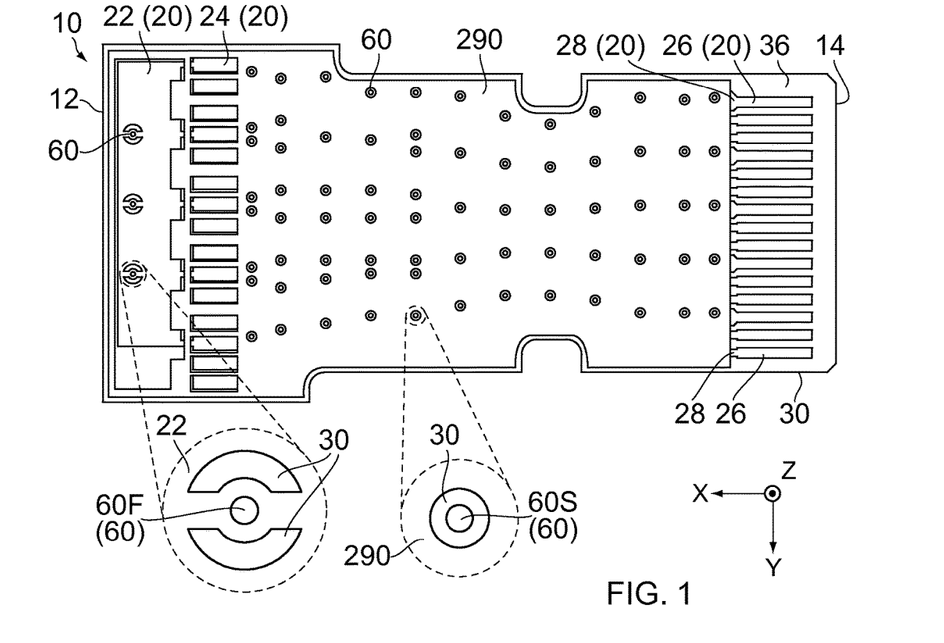
FIG. 1 is a top view showing a printed wiring board according to an embodiment of the present invention, wherein the vicinity of a via connected to a common ground plane (the part encircled by dashed line) and the vicinity of another via connected to a ground pattern (the part encircled by other dashed line) are enlarged to be illustrated.
Figure 4:
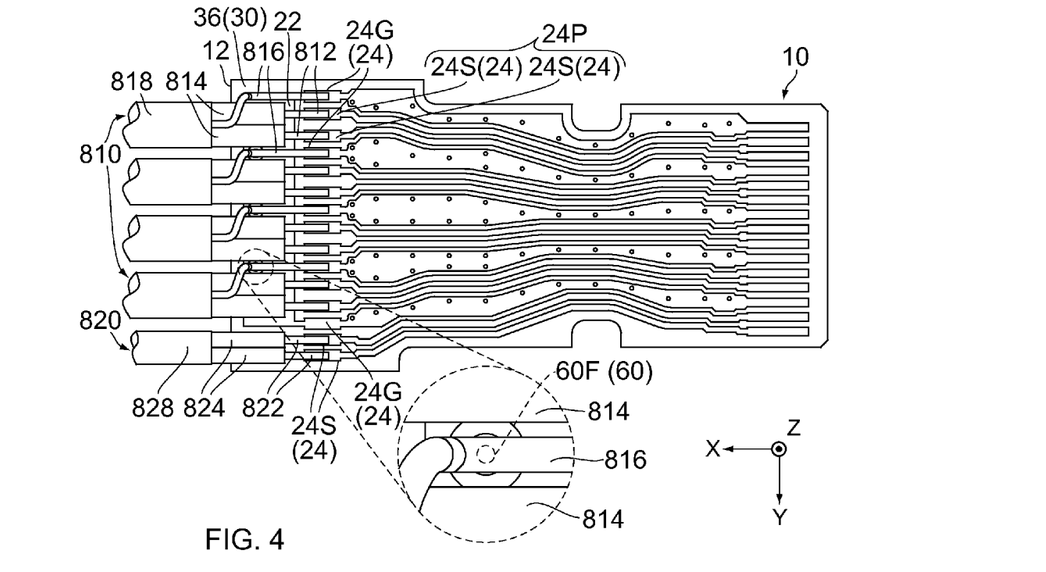
FIG. 4 is another top view showing the printed wiring board of FIG. 2, wherein twinaxial cables and a twisted pair cable are attached to the printed wiring board, and the vicinity of the hidden via connected to the common ground plane (the part encircled by dashed line) is enlarged to be illustrated.

As can be seen from FIGS. 1 and 4, a printed wiring board 10 according to an embodiment of the present invention can be used as a relay board that relays electric signals. In detail, the printed wiring board 10 has a front end 12 and a rear end 14 in a front-rear direction (X-direction). The printed wiring board 10 is a relay board which interconnects between various cables attached to the front end 12 and a connection object (not shown) connected to the rear end 14. The connection object may be, for example, a connector or a cable. The printed wiring board 10 may be a relay board used in a connector.

Figure 3:
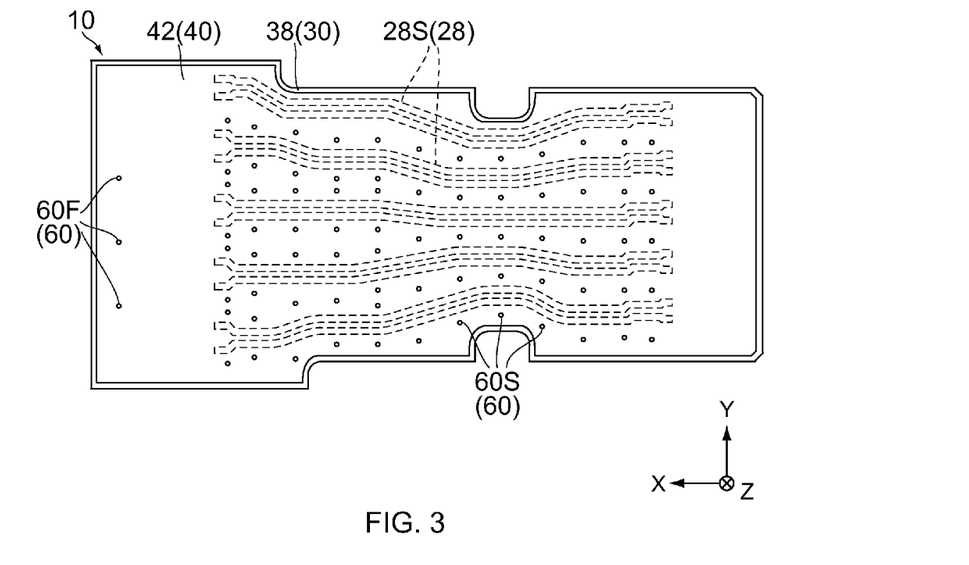
FIG. 3 is a bottom view showing the printed wiring board of FIG. 2, wherein an outline of each of signal coupling patterns formed on an upper surface of the printed wiring board is illustrated by dashed line.
Figure 5:
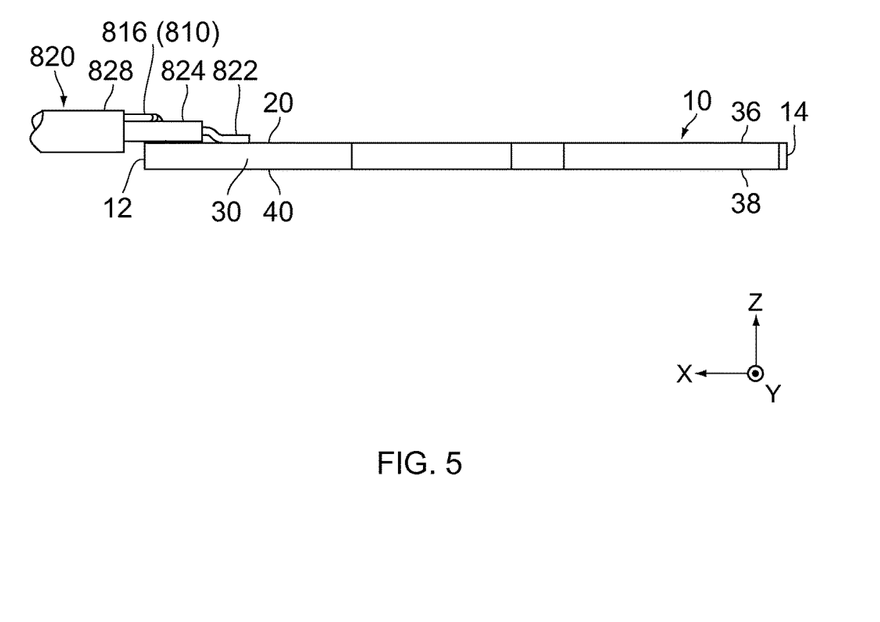
FIG. 5 is a side view showing the printed wiring board of FIG. 4.

Referring to FIGS. 1, 3 and 5, the printed wiring board 10 comprises a pattern layer 20, an insulating layer 30 and a ground layer 40 laminated in an upper-lower direction (Z-direction). The insulating layer 30 has an upper surface 36 and a lower surface 38 which are perpendicular to the Z-direction. The upper surface 36 is formed with the pattern layer 20 thereon, and the lower surface 38 is formed with the ground layer 40 thereon. In other words, the insulating layer 30 is provided between the pattern layer 20 and the ground layer 40.

In the present embodiment, the insulating layer 30 is made of insulating material such as resin, and each of the pattern layer 20 and the ground layer 40 is constituted of various conductive patterns each made of conducting material such as copper foil. Moreover, the printed wiring board 10 is formed with a plurality of vias 60. Each of the vias 60 electrically connects the conductive pattern of the pattern layer 20 and the conductive pattern of the ground layer 40 with each other.

As shown in FIG. 3, the ground layer 40 is formed with a ground pattern 42 as the conductive pattern. According to the present embodiment, the ground pattern 42 covers almost all the lower surface 38 so that the ground layer 40 has no conductive pattern except the ground pattern 42. However, the ground layer 40 may be formed with a conductive pattern other than the ground pattern 42.

Figure 2:
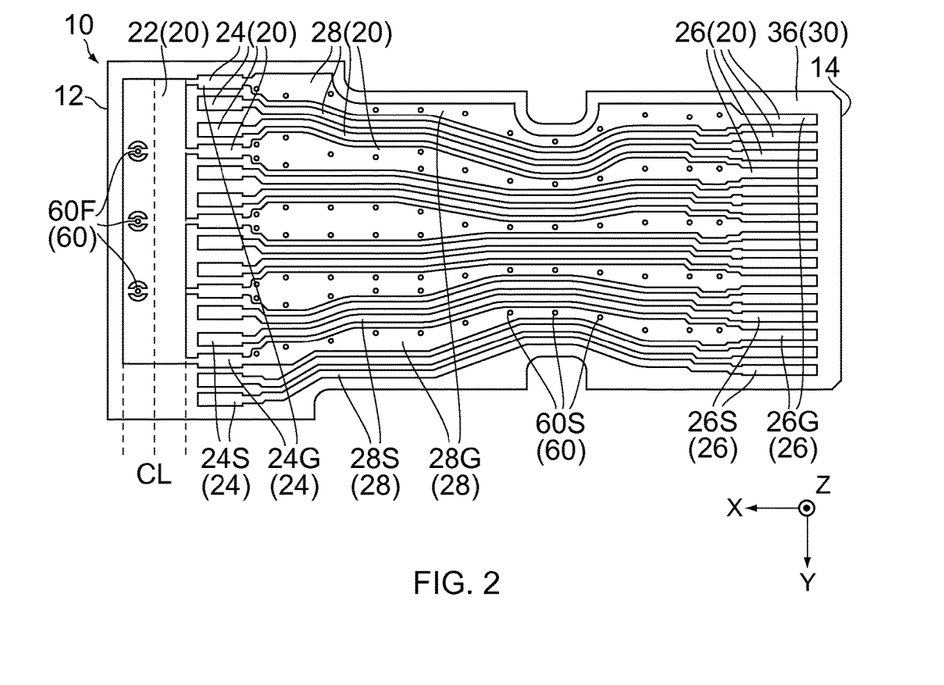
FIG. 2 is another top view showing the printed wiring board of FIG. 1, wherein a resist of the printed wiring board is not illustrated.

As shown in FIGS. 1 and 2, the pattern layer 20 is formed with one common ground plane 22, a plurality of pads 24, a plurality of connection portions 26 and a plurality of coupling patterns 28 as the conductive patterns. The coupling patterns 28 are almost completely covered by a resist 290 made of insulating material. The pattern layer 20 may be formed with another conductive pattern.

As shown in FIG. 2, the common ground plane 22 is located in the vicinity of the front end 12 of the printed wiring board 10 and extends along a lateral direction (Y-direction). The common ground plane 22 is located forward of the pads 24, or toward the front end 12, in the X-direction. The pads 24 are arranged in the lateral direction (Y-direction), and each of the pads 24 is positioned at a position which is nearer to the front end 12 than to the rear end 14 in the X-direction. In the present embodiment, except for the positive Y-side two pads 24, the pads 24 are located just behind the common ground plane 22 with a little distance from the common ground plane 22.

The connection portions 26 are located in the vicinity of the rear end 14 of the printed wiring board 10 and arranged in the Y-direction. The connection portions 26 correspond to the pads 24, respectively. More specifically, the connection portions 26 are connected with the pads 24 by the coupling patterns 28, respectively. In other words, each of the coupling patterns 28 couples the corresponding pad 24 and the corresponding connection portion 26 with each other.

As shown in FIGS. 2 and 4, the pads 24 include one or more ground pads 24G and one or more signal pads 24S. In the present embodiment, the number of the ground pads 24G is five, and the number of the signal pads 24S is ten. The ground pads 24G are connected with the common ground plane 22, while the signal pads 24S are unconnected with the common ground plane 22. In other words, the ground pads 24G are some of the pads 24 that are connected with the common ground plane 22.

The pads 24 according to the present embodiment include a plurality of, or four, signal pad pairs 24P each constituted of two of the signal pads 24S. Moreover, the pads 24 include the two signal pads 24S that constitute no signal pad pair 24P. As described later, the signal pad pairs 24P are used when differential signals (difference signals) are transmit. The signal pads 24S that constitute no signal pad pair 24P are located at the positive Y-side of the printed wiring board 10.

In the present embodiment, the number of the ground pads 24G included in the pads 24 is just one more than the number of the signal pad pairs 24P included in the pads 24. The ground pads 24G and the signal pad pairs 24P are arranged alternately in the Y-direction. In other words, each of the signal pad pairs 24P is interposed between two of the ground pads 24G in the Y-direction. There is not provided any conductive pattern except the signal pad pair 24P between the ground pads 24G that interpose this signal pad pair 24P therebetween.

As shown in FIG. 2, the connection portions 26 include five ground connection portions 26G and ten signal connection portions 26S similar to the pads 24. Similarly, the coupling patterns 28 include five ground coupling patterns 28G and ten signal coupling patterns 28S. The ground coupling patterns 28G couple the ground pads 24G with the ground connection portions 26G, respectively, and the signal coupling patterns 28S couple the signal pads 24S with the signal connection portions 26S, respectively. In other words, some of the connection portions 26 that are coupled with the ground pads 24G are the ground connection portions 26G while the other some of the connection portions 26 that are coupled with the signal pads 24S are the signal connection portions 26S.

According to the present embodiment, the ground pads 24G and the signal pads 24S have shapes and sizes same as one another. The ground connection portions 26G and the signal connection portions 26S also have shapes and sizes same as one another and are arranged with equal intervals therebetween in the Y-direction. In contrast, a width, or a size in the Y-direction, of the ground coupling pattern 28G is larger than another width of the signal coupling pattern 28S. However, the present invention is not limited thereto. For example, the ground pad 24G may have a shape and a size different from those of the signal pad 24S.

Referring to FIGS. 1 to 3, the vias 60 according to the present embodiment include three first vias (vias) 60F and a plurality of second vias (vias) 60S. In the pattern layer 20, the vias 60F are provided in the common ground plane 22, and the vias 60S are provided in the ground coupling patterns 28G. In the ground layer 40, the vias 60F and the vias 60S are provided in the ground pattern 42. Accordingly, the common ground plane 22 is electrically connected with the ground pattern 42 of the ground layer 40 by at least one of the vias 60, or by the via 60F, and each of the ground coupling patterns 28G is electrically connected with the ground pattern 42 by at least one of the vias 60, or by the via 60S. In other words, some of the vias 60 that are provided in the common ground plane 22 are the first vias 60F while the other some of the vias 60 that are provided in the ground coupling patterns 28G are the second vias 60S.

According to the present embodiment, while each of the vias 60F is provided with a thermal land formed therearound, the vias 60F and the vias 60S have shapes and sizes same as one another. However, the present invention is not limited thereto. For example, the via 60F and the via 60S may have sizes different from each other.

As shown in FIGS. 4 and 5, the printed wiring board 10 is connected to various cables when used. In the present embodiment, four twinaxial cables (cables) 810 and one twisted pair cable (cable) 820 are attached to the upper surface 36 of the printed wiring board 10.

As shown in FIG. 4, each of the cables 810 comprises two signal conductors 812, two insulators 814, a drain wire 816 and a cover 818, wherein the insulators 814 cover the signal conductors 812, respectively, the drain wire 816 is provided outside of the insulators 814, and the cover 818 covers the insulators 814 and the drain wire 816. The cover 818 and the insulators 814 are peeled off at an end portion, or the negative X-side end portion, of the cable 810 so that the drain wire 816 and the signal conductors 812 are exposed outward. The insulators 814 are positioned and fixed to the common ground plane 22 and the upper surface 36 of the printed wiring board 10 by an adhesive or the like. The signal conductors 812 are connected and fixed to the signal pads 24S of the signal pad pair 24P, respectively, by soldering or the like. The drain wire 816 is connected and fixed to the ground pad 24G by soldering or the like.

The cable 820 comprises two signal conductors 822, two insulators 824 and a cover 828, wherein the insulators 824 cover the signal conductors 822, respectively, and the cover 828 covers the insulators 824. The cover 828 and the insulators 824 are peeled off at an end portion of the cable 820 so that the signal conductors 822 are exposed outward. The insulators 824 are positioned and fixed to the common ground plane 22 and the upper surface 36 of the printed wiring board 10 by an adhesive or the like. The signal conductors 822 are connected and fixed to the signal pads 24S that constitute no signal pad pair 24P, respectively, by soldering or the like.

In the present embodiment, as described above, the insulators 814 and the insulators 824 is positioned and fixed by using an adhesive or the like. However, the present invention is not limited thereto. For example, the insulators 814 and the insulators 824 may be positioned and fixed by using a fixing member such as a connector (not shown) or a hood (not shown) which covers the connector.

Referring to FIG. 4, the end portion (exposed portion) of the cable 810 has impedance larger than that of the part other than the end portion of the cable 810 because the signal conductor 822 in the end portion is not covered by any portion which has the ground potential. However, according to the present embodiment, the common ground plane 22, the ground pads 24G and the ground patterns 42 (see FIG. 3) are connected together to have the ground potential. Moreover, the exposed portion of the cable 810 is arranged on the common ground plane 22. Accordingly, the impedance of the cable 810 is matched so that signal characteristics are hardly degraded even when the cable 810 is used to transmit high frequency signals.

Figure 6:
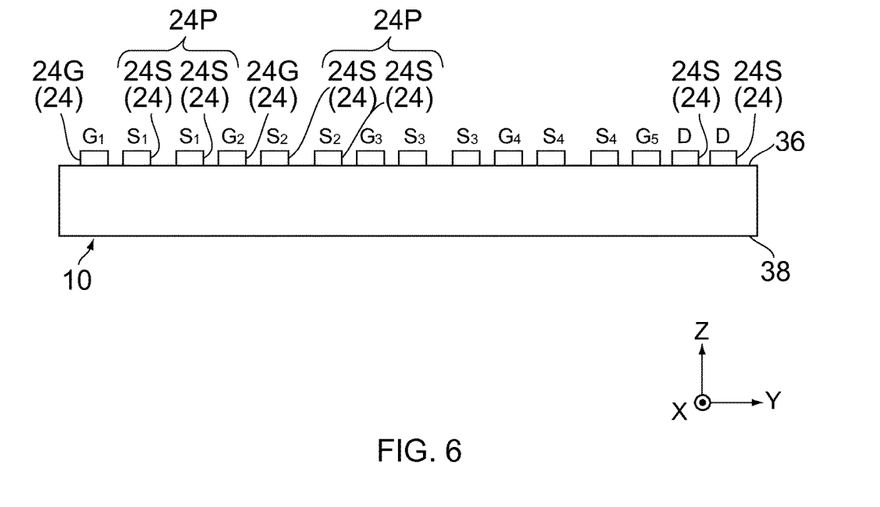
FIG. 6 is a front view schematically showing pads of the printed wiring board of FIG. 1.

Moreover, referring to FIG. 6, any neighboring two of the signal pad pairs 24P in the Y-direction are screened from each other by the ground pad 24G. This structure prevents crosstalk between the signal pad 24S of one of the signal pad pairs 24P and the signal pad 24S of a remaining one of the signal pad pairs 24P, for example, even when the cables 810 transmit differential signals (difference signals). In other words, the crosstalk between the signal pads 24S along the upper surface 36 of the printed wiring board 10 can be prevented. In particular, according to the present embodiment, no special member is required to prevent the crosstalk. Accordingly, the pitch between the signal pads 24S can be made smaller. The printed wiring board 10 according to the present embodiment is therefore suitable to be reduced in size.

As shown in FIG. 2, according to the present embodiment, each of the ground pads 24G is directly connected to the common ground plane 22 by a short conductive pattern (connection pattern). In other words, the ground pads 24G are connected with the common ground plane 22 at the pattern layer 20. However, the ground pads 24G may be connected with the common ground plane 22 at the ground layer 40 (see FIG. 3). For example, each of the ground pads 24G may be formed with the via 60 while not being provided with the aforementioned connection pattern. However, from a view point of making the ground potential more stable to more surely obtain the effect such as the match of the impedance and the prevention of the crosstalk, the ground pads 24G are preferred to be directly connected to the common ground plane 22 similar to the present embodiment.

Referring to FIGS. 2 and 3, the ground pattern 42 of the ground layer 40 is formed at least just below the signal coupling patterns 28S that are connected to the signal pads 24S. Thus, the signal coupling patterns 28S form microstrip lines together with the insulating layer 30 and the ground pattern 42. In order for the microstrip lines to be formed, it is sufficient that the ground pattern 42 is formed only just below the signal coupling patterns 28S. However, from a view point of making the ground potential more stable, the ground pattern 42 is preferred to be a solid pattern similar to the present embodiment.

As can be seen from FIG. 2, the common ground plane 22 has an imaginary middle line CL which passes a middle point of the common ground plane 22 in the X-direction. The vias 60F are located forward of the middle line CL, or the middle point. In other words, the vias 60F are formed to be located as near as possible to the front end 12 in the X-direction. Moreover, the vias 60F are formed not only at the middle part of the common ground plane 22 in the Y-direction but also at opposite sides thereof in the Y-direction. Accordingly, the ground potential can be made more stable.

Referring to FIGS. 3 and 4, according to the present embodiment, each of the ground coupling patterns 28G connected to the ground pads 24G is connected with the ground pattern 42 by two or more of the vias 60S. The vias 60S are provided at least at opposite ends of the ground coupling pattern 28G in the X-direction. Accordingly, the ground potential can be further made stable. Moreover, the vias 60S are arranged along the ground coupling pattern 28G with small distances left therebetween. When the distance between any two of the vias 60S is designed to be smaller than a predetermined value that is defined by the wavelength of the signals transmitted by the cable 810, the ground pattern 42 can be prevented from generating resonance.

As shown in FIGS. 2 and 4, each of the vias 60F is located at a position different from another position of any of the signal pads 24S in the Y-direction. Accordingly, the insulator 814 of the cable 810 can be stably placed on the common ground plane 22 without being interfered by the vias 60F.

The printed wiring board 10 according to the present embodiment can be variously modified as explained below in addition to the modifications which are already described.

Referring to FIG. 2, the pattern layer 20 may be formed with another ground pad 24G in addition to the ground pads 24G which interpose the signal pad pair 24P. Moreover, the number of the signal pad pairs 24P may be one. Accordingly, it is sufficient that the pads 24 include one or more of the signal pad pairs 24P and include ground pads 24G more than the signal pad pairs 24P.

As can be seen from FIGS. 2 and 3, the common ground plane 22, the ground pads 24G and the ground pattern 42 can be electrically connected together only by the single via 60F. Accordingly, it is sufficient that the printed wiring board 10 is formed with one or more of the vias 60. However, from a view point of making the ground potential stable, the printed wiring board 10 is preferred to have a plurality of the vias 60s similar to the present embodiment.

As shown in FIGS. 7 to 10, the present invention is also applicable to a printed wiring board 10A which is a little different from the printed wiring board 10 (see FIG. 1). As a whole, the printed wiring board 10A has such structure that can be obtained by vertically bonding the printed wiring board 10 to a mirror image of the printed wiring board 10. Each layer of the printed wiring board 10A has a structure basically same as that of the printed wiring board 10 and show effect similar to that of the printed wiring board 10. Hereafter, explanation is mainly made about differences between the structures of the printed wiring board 10A and those of the printed wiring board 10.

Figure 8:
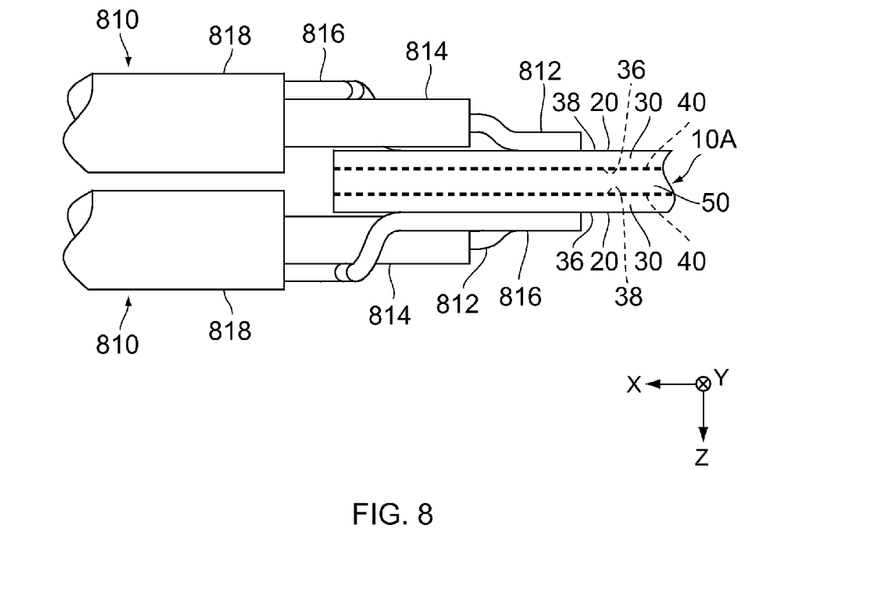
FIG. 8 is a side view showing a front end part of the printed wiring board of FIG. 7, wherein a position of each of ground layers of printed wiring board is illustrated by dashed line.

As shown in FIG. 8, the printed wiring board 10A comprises two sets each of which is constituted of the pattern layer 20, the insulating layer 30 and the ground layer 40, and comprises an inner insulating layer 50. These two sets are laminated in the Z-direction with the inner insulating layer 50 sandwiched therebetween. In the upper (positive Z-side) set, the pattern layer 20 is located at the upper surface 36 while the ground layer 40 is located at the lower surface 38. In the lower (negative Z-side) set, the pattern layer 20 is located at the lower surface 38 while the ground layer 40 is located at the upper surface 36. The inner insulating layer 50 is provided between the ground layers 40 of the two sets.

Figure 7:
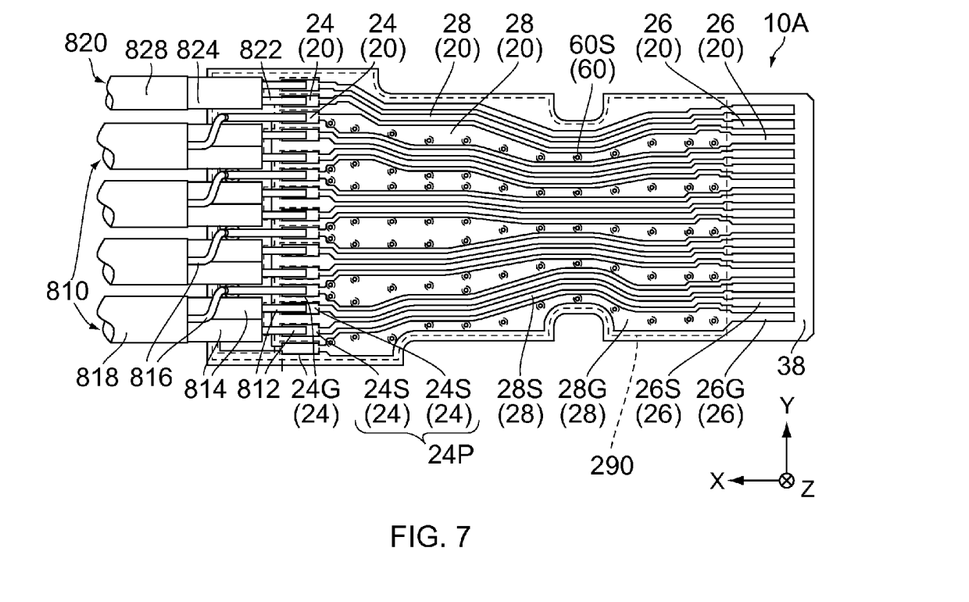
FIG. 7 is a bottom view showing a modification of the printed wiring board of FIG. 1, wherein the twinaxial cables and the twisted pair cable are attached to the printed wiring board, and an outline of the resist of the printed wiring board is illustrated by dashed line.

Referring to FIG. 8 together with FIG. 1, the pattern layer 20 of the upper set of the printed wiring board 10A has the structure same as that of the pattern layer 20 of the printed wiring board 10 and is covered by the resist 290. Referring to FIG. 7 together with FIG. 1, the pattern layer 20 of the lower set of the printed wiring board 10A is a mirror image of the pattern layer 20 of the printed wiring board 10 with respect to the XY-plane and is covered by the resist 290. In other words, the common ground plane 22, the pads 24, the connection portions 26 and the coupling patterns 28 formed on the pattern layer 20 of one of the sets, or the upper set, are arranged mirror symmetrically to the common ground plane 22, the pads 24, the connection portions 26 and the coupling patterns 28 formed on the pattern layer 20 of a remaining one of the sets, or the lower set, with respect to a predetermined plane (horizontal plane) that is defined by the X-direction and the Y-direction, or the XY-plane.

Similarly, referring to FIG. 8 together with FIG. 3, the ground layer 40 of the upper set of the printed wiring board 10A has the structure same as that of the ground layer 40 of the printed wiring board 10, while the ground layer 40 of the lower set of the printed wiring board 10A is a mirror image of the ground layer 40 of the printed wiring board 10 with respect to the XY-plane. In other words, the ground pattern 42 formed on the ground layer 40 of one of the sets, or the upper set, is arranged mirror symmetrically to the ground pattern 42 formed on the ground layer 40 of a remaining one of the sets, or the lower set, with respect to the XY-plane.

Referring to FIG. 7, because the printed wiring board 10A has the aforementioned mirror-symmetrical structure, each of the vias 60 can pierce the printed wiring board 10A in the Z-direction. The printed wiring board 10A therefore has a structure which can be easily manufactured.

Figure 9:
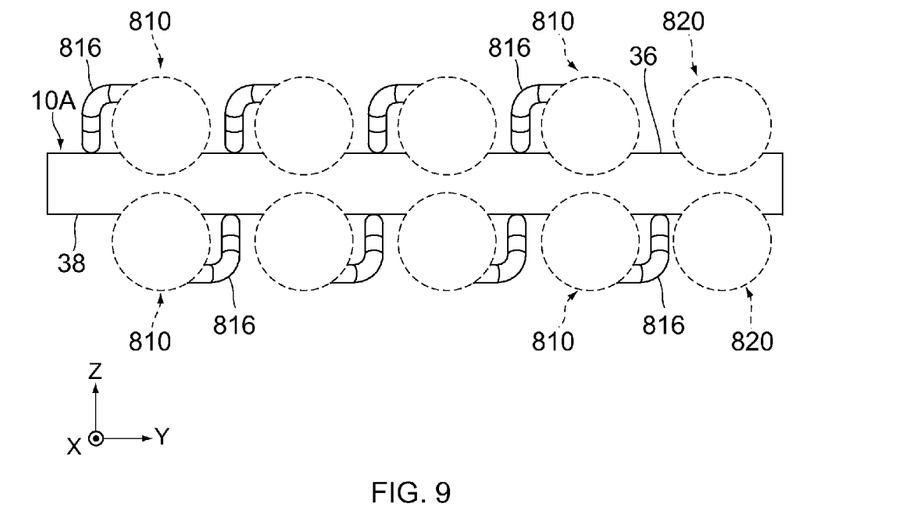
FIG. 9 is a front view showing the printed wiring board of FIG. 7, wherein an outer boundary of each of the twinaxial cables and the twisted pair cable is illustrated by dashed line.
Figure 10:
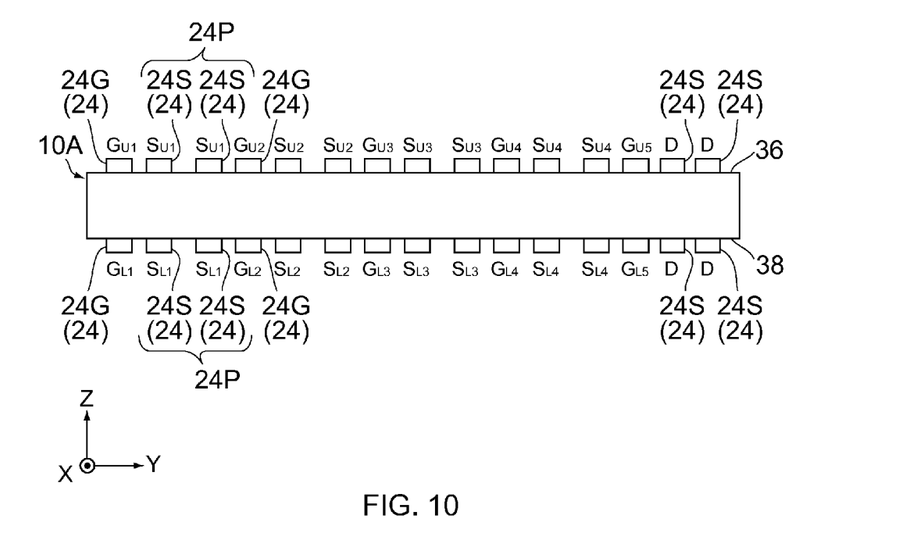
FIG. 10 is a front view schematically showing the pads of the printed wiring board of FIG. 7.

As can be seen from FIGS. 7 to 9, similar to the upper surface 36 of the printed wiring board 10 (see FIG. 4), each of the pads 24 on the upper surface 36 and the lower surface 38 of the printed wiring board 10A is connected to the cable 810 or the cable 820 when used. Accordingly, as shown in FIG. 10, similar to the upper surface 36 of the printed wiring board 10 (see FIG. 6), each of the signal pad pairs 24P can be interposed by the ground potential, or by the ground pads 24G, on each of the upper surface 36 and the lower surface 38.

Figure 11:
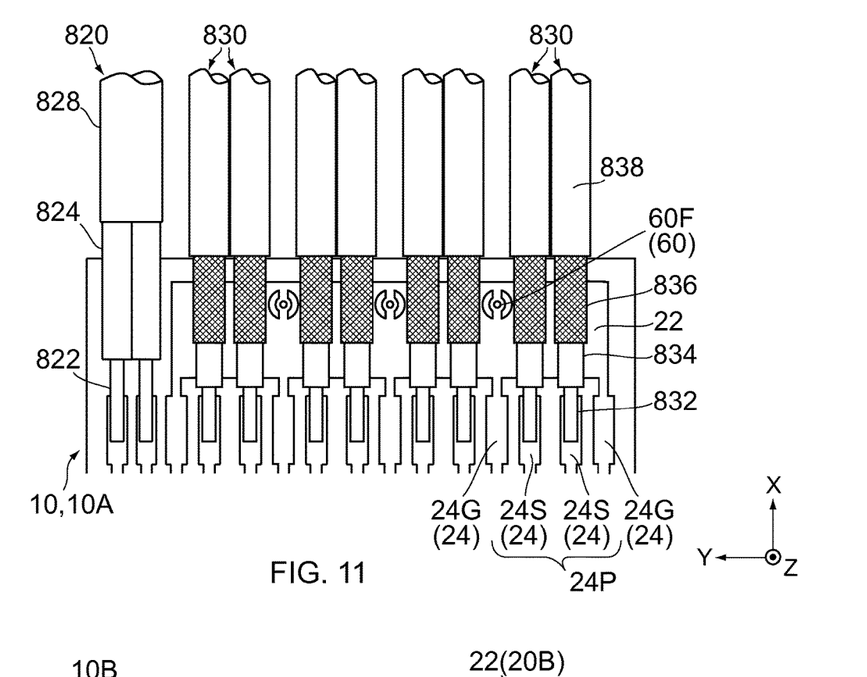
FIG. 11 is a top view showing a front end part of the printed wiring board of FIGS. 1 and 7, wherein coaxial cables instead of the twinaxial cables are attached to the printed wiring board, and the resist of the printed wiring board is not illustrated.

Referring to FIGS. 4 and 11, any one of the printed wiring board 10 and the printed wiring board 10A can be connected to coaxial cables (cables) 830 attached thereto instead of the cables 810. Each of the cables 830 comprises a signal conductor 832, an insulators 834, a ground conductor 836 and a cover 838, wherein the insulator 834 covers the signal conductor 832, the ground conductor 836 covers the insulator 834, and the cover 838 covers the ground conductor 836. The cover 838 and the insulator 834 are peeled off at an end portion of the cable 830 so that the ground conductor 836 and the signal conductor 832 are exposed outward.

Referring to FIGS. 4 and 11, differential signals (difference signals) can be transmitted by using a pair of the cables 830 instead of the one cable 810. In detail, according to the present modification, the signal conductors 832 of the pair of the cables 830 are connected and fixed to the signal pads 24S of the signal pad pair 24P by soldering or the like, respectively, and the ground conductors 836 of the pair of the cables 830 are connected and fixed to the common ground plane 22 by soldering or the like. According to the present embodiment, as shown in FIGS. 6 and 10, the signal pad pair 24P also can be interposed by the ground potential, or the ground pads 24G, in the Y-direction.

As explained below, the printed wiring board 10 according to the present embodiment is also applicable to a relay board which does not relay differential signals (difference signals).

Figure 12:
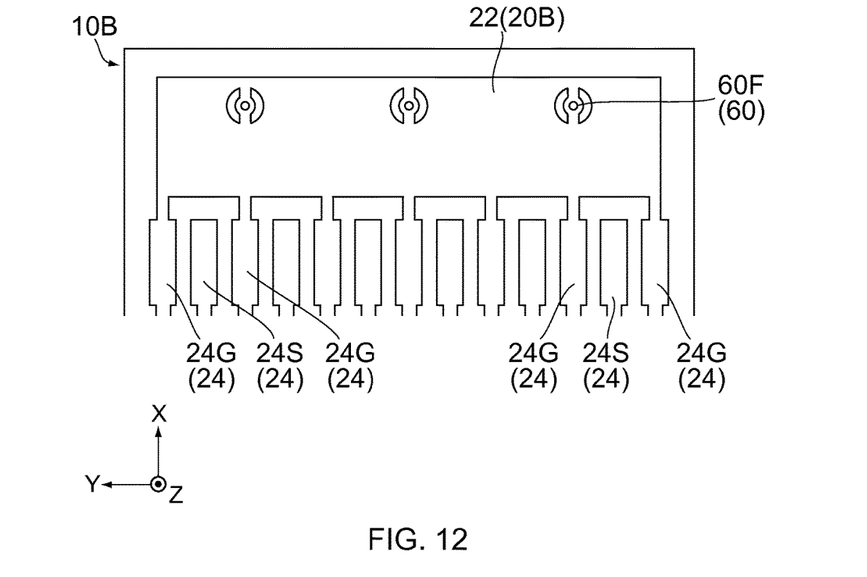
FIG. 12 is a top view showing another modification of a front end part of the printed wiring board of FIG. 1.

Referring to FIG. 12, a printed wiring board 10B is formed same as the printed wiring board 10 (see FIG. 1) or the printed wiring board 10A (see FIG. 7) except that the printed wiring board 10B comprised a pattern layer 20B which is a little different from the pattern layer 20 of each of the printed wiring board 10 and the printed wiring board 10A.

The pattern layer 20B includes the common ground plane 22 same as that of the pattern layer 20 (see FIG. 2) and includes the pads 24 having shapes and sizes same as those of the pads 24 (see FIG. 2) of the pattern layer 20. However, an arrangement of the pads 24 on the pattern layer 20B is different from that on the pattern layer 20. More specifically, the pads 24 of the pattern layer 20B include the one or more signal pads 24S (in the present embodiment, the six signal pads 24S) and the two or more ground pads 24G (in the present embodiment, the seven ground pads 24G). The number of the ground pads 24G included in the pads 24 is more than, by just one, the number of the signal pads 24S included in the pads 24. The ground pads 24G and the signal pads 24S are arranged alternately in the Y-direction.

For example, when the printed wiring board 10B is used, the signal conductor 832 of each of the cables 830 (see FIG. 11) is connected to the signal pad 24S while the ground conductor 836 is connected to the common ground plane 22. Under a state where the cables 830 are thus connected, even when the cables 830 transmit high-frequency analog signals, impedance of the cable 830 can be matched and cross-talk between the signal pads 24S can be prevented.

The pattern layer 20B can be modified variously. For example, when one or more of the signal pads 24S do not need to be interposed by the ground pads 24G, the number of the ground pads 24G may be smaller than the number of the signal pads 24S. However, also in this case, the pads 24 include a plurality of the ground pads 24G. Moreover, at least one of the signal pads 24S is interposed between two of the ground pads 24G in the Y-direction.

Referring to FIGS. 2 and 12, the pattern layer 20 and the pattern layer 20B can be combined. For example, the pattern layer may include both the signal pad pair 24P interposed by the ground pads 24G and the isolated signal pad 24S interposed by the ground pads 24G.

The present application is based on a Japanese patent application of JP2014-079092 filed before the Japan Patent Office on Apr. 8, 2014, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A printed wiring board comprising a pattern layer, an insulating layer and a ground layer laminated in an upper-lower direction, wherein:

the printed wiring board is formed with one or more vias;
the printed wiring board has a front end and a rear end in a front-rear direction perpendicular to the upper-lower direction;
the insulating layer is provided between the pattern layer and the ground layer;
the ground layer is formed with a ground pattern;
the pattern layer is formed with one common ground plane, two or more pads, two or more connection portions, and two or more coupling patterns;
the pads are arranged in a lateral direction perpendicular to both the upper-lower direction and the front-rear direction;
each of the pads is positioned at a position which is nearer to the front end than to the rear end in the front-rear direction;
the common ground plane is a unitary conductive pattern entirely located forward of the pads in the front-rear direction;
the vias include a first via that connects the common ground plane and the ground pattern with each other;
the pads include one or more ground pads and one or more signal pads;
the ground pads are connected with the common ground plane;
the signal pads are unconnected with the common ground plane;
the connection portions correspond to the pads, respectively;
the coupling patterns couple the pads with the connection portions, respectively;
the coupling patterns include a ground coupling pattern that is connected to the ground pad;
the common ground plane has a middle point in the front-rear direction;
the first via is located forward of the middle point;
the common ground plane has a front edge and a rear edge each of which is located forward of the pads and extends along the lateral direction; and
a first distance between the middle point and the front edge in the front-rear direction is equal to a second distance between the middle point and the rear edge in the front-rear direction.

2. The printed wiring board as recited in claim 1, wherein:
the pads include one or more signal pad pairs each constituted of two of the signal pads;
the number of the ground pads included in the pads is more than the number of the signal pad pairs included in the pads; and
each of the signal pad pairs is interposed between two of the ground pads in the lateral direction.

3. The printed wiring board as recited in claim 2, wherein:
the pads include the two or more signal pad pairs;
the number of the ground pads included in the pads is just one more than the number of the signal pad pairs included in the pads; and
the ground pads and the signal pad pairs are arranged alternately in the lateral direction.

4. The printed wiring board as recited in claim 1, wherein:
the pads include the two or more ground pads; and
at least one of the signal pads is interposed between two of the ground pads in the lateral direction.

5. The printed wiring board as recited in claim 4, wherein:
the number of the ground pads included in the pads is just one more than the number of the signal pads included in the pads; and the ground pads and the signal pads are arranged alternately in the lateral direction.

6. The printed wiring board as recited in claim 1, wherein the ground pads are connected with the common ground plane at the pattern layer.

7. The printed wiring board as recited in claim 1, wherein the first via is located at a position different from positions of the signal pads in the lateral direction.

8. The printed wiring board as recited in claim 1, wherein:
the coupling patterns include a signal coupling pattern that is connected to the signal pad; and
the ground pattern of the ground layer is formed at least just below the signal coupling pattern.

9. The printed wiring board as recited in claim 1, wherein:
the vias include a second via that connects the ground coupling pattern and the ground pattern with each other.

10. The printed wiring board as recited in claim 1, wherein:
the printed wiring board comprises two sets each of which is constituted of the pattern layer, the insulating layer, and the ground layer;
the printed wiring board comprises an inner insulating layer;
the inner insulating layer is provided between the ground layers of the two sets;
the common ground plane, the pads, the connection portions, and the coupling patterns formed on the pattern layer of one of the sets are arranged mirror symmetrically to the common ground plane, the pads, the connection portions, and the coupling patterns formed on the pattern layer of a remaining one of the sets with respect to a predetermined plane that is defined by the front-rear direction and the lateral direction; and
the ground pattern formed on the ground layer of one of the sets is arranged mirror symmetrically to the ground pattern formed on the ground layer of a remaining one of the sets with respect to the predetermined plane.

* * * * *